(12) United States Patent
Kim et al.

(10) Patent No.: US 10,930,334 B2
(45) Date of Patent: Feb. 23, 2021

(54) FEEDBACK FIELD-EFFECT ELECTRONIC DEVICE USING FEEDBACK LOOP OPERATION AND ARRAY CIRCUIT USING FEEDBACK FIELD-EFFECT ELECTRONIC DEVICE

(71) Applicant: Korea University Research and Business Foundation, Seoul (KR)

(72) Inventors: Sang Sig Kim, Seoul (KR); Kyoung Ah Cho, Seoul (KR); Jin Sun Cho, Seoul (KR); Doo Hyeok Lim, Seoul (KR); Sol A Woo, Gwacheon-si (KR)

(73) Assignee: Korea University Research and Business Foundation, Seoul (KR)

( * ) Notice: Subject to any disclaimer, the term of this patent is extended or adjusted under 35 U.S.C. 154(b) by 345 days.

(21) Appl. No.: 16/181,669

(22) Filed: Nov. 6, 2018

(65) Prior Publication Data
US 2020/0075077 A1 Mar. 5, 2020

(30) Foreign Application Priority Data

Sep. 5, 2018 (KR) ........................ 10-2018-0106114

(51) Int. Cl.
*G11C 11/39* (2006.01)
*H01L 29/08* (2006.01)
(Continued)

(52) U.S. Cl.
CPC ............ *G11C 11/39* (2013.01); *H01L 23/528* (2013.01); *H01L 27/1052* (2013.01);
(Continued)

(58) Field of Classification Search
CPC ..................................................... G11C 11/39
See application file for complete search history.

(56) References Cited

U.S. PATENT DOCUMENTS 6,690,039 B1   2/2004  Nemati et al.
7,893,456 B1 *  2/2011  Nemati ................. H01L 29/749
                                                          257/107

(Continued)

FOREIGN PATENT DOCUMENTS

KR    10-2002-0017752 A    3/2002
KR       20020017752 A *   3/2002

(Continued)

OTHER PUBLICATIONS

Cho et al., "Static Random Access Memory Characteristics of Single-Gated Feedback Field-Effect Transistors," IEEE Transactions on Electron Devices, vol. 66, No. 1, Jan. 2019, pp. 413-419, published Dec. 3, 2018 (Year: 2018).*

(Continued)

*Primary Examiner* — Richard Elms
*Assistant Examiner* — R Lance Reidlinger
(74) *Attorney, Agent, or Firm* — NSIP Law (57) ABSTRACT

The present disclosure discloses a feedback field-effect electronic device using a feedback loop operation and an array circuit using the feedback field-effect electronic device. According to one embodiment of the present disclosure, the array circuit includes a plurality of feedback field-effect electronic devices in which the source region of a diode structure and the drain region of an access electronic device are connected in series, wherein the diode structure is connected to a bit line and a first word line, the access electronic device is connected to a source line and a second word line, and a random access operation is performed by selectively applying voltage to the bit line and the first and second word lines.

12 Claims, 10 Drawing Sheets

(51) Int. Cl.
*H01L 29/749* (2006.01)
*H01L 27/105* (2006.01)
*H01L 29/36* (2006.01)
*H01L 29/49* (2006.01)
*H01L 29/45* (2006.01)
*H01L 23/528* (2006.01)

(52) U.S. Cl.
CPC .......... *H01L 29/0847* (2013.01); *H01L 29/36* (2013.01); *H01L 29/45* (2013.01); *H01L 29/495* (2013.01); *H01L 29/749* (2013.01)

(56) References Cited

U.S. PATENT DOCUMENTS

| | | | | |
|---|---|---|---|---|
| 8,125,003 B2* | 2/2012 | Bhattacharyya | ........ | H01L 21/84 257/154 |
| 8,519,431 B2* | 8/2013 | Nemati | ............... | H01L 27/0817 257/110 |
| 8,537,610 B2* | 9/2013 | Okhonin | ............. | H01L 27/1023 365/185.01 |
| 2015/0070983 A1* | 3/2015 | Kumura | ............... | G11C 11/1657 365/158 |

FOREIGN PATENT DOCUMENTS

| | | |
|---|---|---|
| KR | 10-2017-0127645 A | 11/2017 |
| KR | 10-1835231 B1 | 3/2018 |
| KR | 10-1857873 B1 | 6/2018 |

OTHER PUBLICATIONS

Nemati et al., "A Novel Thyristor-based SRAM Cell (T-RAM) for High-Speed, Low-Volage, Giga-scale Memories," International Electron Devices Meeting 1999. Technical Digest (Cat. No. 99CH36318), Dec. 1999, pp. 11.5.1-11.5.4 (Year: 1999).*

* cited by examiner

FEEDBACK FIELD-EFFECT ELECTRONIC DEVICE USING FEEDBACK LOOP OPERATION AND ARRAY CIRCUIT USING FEEDBACK FIELD-EFFECT ELECTRONIC DEVICE

CROSS-REFERENCE TO RELATED APPLICATION

This application claims priority to Korean Patent Application No. 10-2018-0106114, filed on Sep. 5, 2018 in the Korean Intellectual Property Office, the disclosure of which is incorporated herein by reference.

BACKGROUND OF THE DISCLOSURE

Field of the Disclosure

The present disclosure relates to a feedback field-effect electronic device using a feedback loop operation and an array circuit using the feedback field-effect electronic device. More specifically, the present disclosure relates to a feedback field-effect electronic device using a feedback loop operation, capable of implementing a feedback loop memory mechanism by selectively applying voltage to a bit line and two word lines, and relates to an array circuit using the feedback field-effect electronic device.

DESCRIPTION OF THE RELATED ART

Internet of things generally refers to a technology for wirelessly connecting various objects by incorporating sensors and communication functions in the objects.

According to Internet of things, data is exchanged between objects, and the resulting learned information is provided to users. To implement such technology of Internet of things, a large-capacity and high-speed memory capable of processing a vast amount of data is required. In addition, since Internet of things uses a battery, a memory device capable of performing operation with ultra-low power is required.

In the case of a DRAM memory device, which is a conventional volatile memory device, one transistor and one capacitor (1T-1C) form a unit cell structure, and the DRAM memory device may be fabricated to have a high degree of integration. However, the operation speed of the DRAM memory device is relatively slow compared to an SRAM memory device. In addition, to operate the DRAM memory device, periodic refresh is required, thereby increasing power consumption.

In addition, in the case of the SRAM memory device, six transistors (6T) form a unit cell structure, and a high-speed operation may be performed. However, the degree of integration is low, and in the case of miniaturization, leakage current may increase, thereby increasing power consumption.

In addition, U.S. Pat. No. 6,690,039 discloses a thyristor-based device. In the disclosed thyristor-based device, Vref is connected to the drain of a p-n-p-n device, and a bit line is connected to the source region of an access transistor.

Therefore, since the thyristor-based device receives a bit-line voltage through an access transistor, some delay may occur during application of a bit-line voltage.

In addition, U.S. Pat. No. 7,893,456 discloses an array using the above-described thyristor-based device.

The disclosed array has a structure in which two word lines are arranged in parallel, and a bit line is arranged to be perpendicular to the word lines.

In the case of a feedback device, two word lines need to be arranged perpendicular to each other to prevent mutual disturbance which may occur in construction of an array circuit.

Therefore, since the array using the thyristor-based device has two word lines arranged parallel to each other, mutual disturbance may occur.

This difference in line arrangement is due to the long carrier lifetime of the intrinsic region of a p-n-i-n structure.

The lifetime of a carrier is affected by doping concentration, and is prolonged at low doping concentrations.

In the case of a MOSFET-based memory device, since the MOSFET-based memory device has a subthreshold swing (SS) of 60 mV/dec or more, the device has a narrow current sensing margin. In addition, in the case of miniaturization of the MOSFET-based memory device, the subthreshold swing may increase, thereby increasing leakage current.

To overcome these problems, various devices having a subthreshold swing of 60 mV/dec or less, such as a tunneling field-effect transistor (TFET), an impact ionization MOSFET (IMOS), and a negative capacitance field-effect transistor (NCFET), have been studied all over the world. However, practical application is limited due to problems such as low on-current, high operating voltage, and complicated processes.

In the case of a memory device driven by a feedback loop memory mechanism according to conventional technologies, a CMOS process may be applied based on a silicon channel, and excellent switching characteristics and low operation voltage characteristics may be exhibited.

Accordingly, research has been conducted to use the memory device driven by a feedback loop memory mechanism according to conventional technologies as a memory array device. However, problems such as interference between memory cells and sneak current make array configuration difficult.

Therefore, it is necessary to develop a memory array device using a conventional CMOS process.

RELATED ART DOCUMENTS

Patent Documents

[Patent Document 1] Korean Patent Application Publication No. 10-2017-0127645, "DUAL-GATE MEMORY DEVICE INCLUDING VERTICAL SEMICONDUCTOR COLUMN"

[Patent Document 2] Korean Patent No. 10-1857873, "LOGIC SEMICONDUCTOR DEVICE"

[Patent Document 3] Korean Patent No. 10-1835231, "SEMICONDUCTOR DEVICE"

[Patent Document 4] U.S. Pat. No. 6,690,039, "THYRISTOR-BASED DEVICE THAT INHIBITS UNDERSIRABLE CONDUCTIVE CHANNEL FORMATION"

[Patent Document 5] U.S. Pat. No. 7,893,456, "THYRISTOR-BASED MEMORY AND ITS METHOD OF OPERATION"

SUMMARY OF THE DISCLOSURE

Therefore, the present disclosure has been made in view of the above problems, and it is one object of the present disclosure to provide an array circuit using a feedback field-effect electronic device using a feedback loop operation, wherein the feedback field-effect electronic device may implement a feedback loop memory mechanism by selectively applying voltage to a bit line and two word lines.

It is another object of the present disclosure to provide a feedback field-effect electronic device having a p-n-i-n transistor and an access transistor connected to each other to perform random access.

It is another object of the present disclosure to provide a feedback field-effect electronic device having a p-n-i-n transistor and an access transistor connected in series to perform a high-speed memory operation without increasing leakage current.

It is another object of the present disclosure to provide an array circuit including a plurality of feedback field-effect electronic devices, wherein interference and sneak current between cells are blocked through access transistors included in each of the feedback field-effect electronic devices.

It is another object of the present disclosure to provide a feedback field-effect electronic device having a p-n-i-n transistor and an access transistor connected in series to improve switching characteristics and lower operating voltage.

It is another object of the present disclosure to provide a feedback field-effect electronic device having a p-n-i-n transistor and an access transistor connected in series to overcome limitations on the subthreshold swing of a conventional MOSFET to secure a high current sensing margin.

It is yet another object of the present disclosure to provide a feedback field-effect electronic device, in which first and second word lines are arranged perpendicular to each other so that occurrence of disturbance between word lines may be prevented and a long carrier lifetime may be secured in a channel region to secure a high retention capacity.

In accordance with one aspect of the present disclosure, provided is an array circuit including a plurality of feedback field-effect electronic devices in which the source region of a diode structure and the drain region of an access electronic device are connected in series, wherein the diode structure is connected to a bit line and a first word line; the access electronic device is connected to a source line and a second word line; and a random access operation is performed by selectively applying voltage to the bit line and the first and second word lines.

According to one embodiment of the present disclosure, when a gate voltage is applied through the first and second word lines, and the voltage magnitude of the bit line is greater than a reference voltage, the diode structure may store data in a first logic state, and when the voltage magnitude of the bit line is less than a reference voltage, the diode structure may store data in a second logic state.

According to one embodiment of the present disclosure, when a gate voltage is not applied through the first and second word lines, and the voltage magnitude of the bit line is greater than a reference voltage, the diode structure may hold the stored data.

According to one embodiment of the present disclosure, when the first gate voltage of the first word line is greater than a first threshold voltage, the diode structure may recognize the first gate voltage as a first state, and when the second gate voltage of the second word line is greater than a second threshold voltage, the diode structure may recognize the second gate voltage as the first state.

According to one embodiment of the present disclosure, when a gate voltage is applied only through the second word line among the first and second word lines, and the voltage magnitude of the bit line is greater than a reference voltage, the diode structure may output current to the source line through the second source region.

According to one embodiment of the present disclosure, when the magnitude of the output current is greater than reference current, the stored data may be in a first logic state, and when the magnitude of the output current is less than reference current, the stored data may be in a second logic state.

According to one embodiment of the present disclosure, the diode structure may include a first source region, a first drain region, an intrinsic region disposed between the first source region and the first drain region, a barrier region disposed between the intrinsic region and the first drain region, and a first gate electrode disposed so as to surround the intrinsic region; and the access electronic device may include a second source region, a second drain region, a gate region, and a second gate electrode disposed so as to surround the gate region, wherein the access electronic device may connect the first source region and the second drain region in series.

According to one embodiment of the present disclosure, the first drain region may be connected to a bit line; the second source region may be connected to a source line; the first gate electrode may be connected to a first word line; and the second gate electrode may be connected to a second word line.

According to one embodiment of the present disclosure, the access electronic device may be formed in the vertical direction in series, so that, after the second source region is formed on the source line and the gate region is formed, the second word line is connected via the second gate electrode, the second drain region is formed, and the first source region is formed on the second drain region.

According to one embodiment of the present disclosure, the diode structure may be formed in the vertical direction, so that, after the intrinsic region is formed on the first source region, the first word line is connected via the first gate electrode, the barrier region is formed on the intrinsic region, the first drain region is formed on the barrier region, and a bit line is formed on the first drain region.

According to one embodiment of the present disclosure, when a gate voltage is applied through the first and second word lines, the diode structure may store data based on the voltage magnitude of the bit line.

According to one embodiment of the present disclosure, the feedback field-effect electronic device may further include a first gate insulating film disposed between the first gate electrode and the intrinsic region, and a second gate insulating film disposed between the second gate electrode and the gate region.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION OF THE DISCLOSURE

Hereinafter, various embodiments of the present disclosure will be described with reference to the accompanying drawings.

It should be understood that embodiments and terminology used herein are not intended to limit the present disclosure, but to include various modifications, equivalents, and/or alternatives of the embodiments.

In the following description of the present disclosure, detailed description of known functions and configurations incorporated herein will be omitted when it may make the subject matter of the present disclosure unclear.

The terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

In this specification, the term "configured to" may be used interchangeably with, for example, "suitable for", "having ability to", "changed to", "made to", "capable of", or "designed to".

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or". That is, unless otherwise mentioned or clearly inferred from context, the expression "x uses a or b" means any one of natural inclusive permutations.

Terms such as "part" and "unit" used below means a unit for processing at least one function or operation, and may be implemented by hardware or software, or a combination of hardware and software.

Figure 1A:
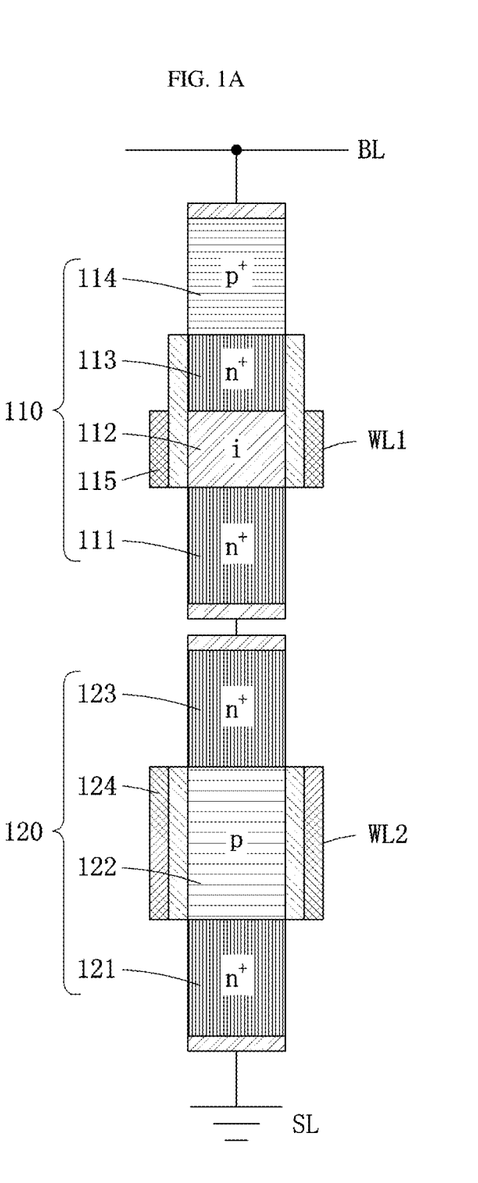
FIGS. 1A to 1C are drawings for explaining a feedback field-effect electronic device according to one embodiment of the present disclosure.

FIG. 1A is a drawing for explaining the components of a feedback field-effect electronic device according to one embodiment of the present disclosure.

In FIG. 1A, a structure of a feedback field-effect electronic device according to one embodiment of the present disclosure, in which a diode structure 110 and an access electronic device 120 are connected to each other in series, is exemplified.

Referring to FIG. 1A, the first drain region of the diode structure 110 may be connected to a bit line BL, the second source region of the access electronic device 120 may be connected to a source line SL, and the first source region of the diode structure 110 and the second drain region of the access electronic device 120 may be connected to each other in series to form one device.

For example, the diode structure may be referred to as any one of a single-gate SiNW FBFET, a p-n-i-n transistor, a memory device, a semiconductor device, and a storage device.

Referring to FIG. 1A, the diode structure 110 may include a first source region 111, an intrinsic region 112, a barrier region 113, and a first drain region 114, and a first gate electrode 115 may be formed and disposed on the intrinsic region 112.

According to one embodiment of the present disclosure, the first gate electrode 115 may be disposed to surround the intrinsic region 112.

According to one embodiment of the present disclosure, the first gate electrode 115 may be connected to a first word line WL1 to receive voltage.

For example, the access electronic device 120 may include a second source region 121, a gate region 122, a second drain region 123, and a second gate electrode 124 disposed so as to surround the gate region 122.

According to one embodiment of the present disclosure, the first source region 111 of the diode structure 110 and the second drain region 123 of the access electronic device 120 may be connected to each other in series.

In addition, the second gate electrode 124 may be connected to a second word line WL2.

According to one embodiment of the present disclosure, the diode structure 110 may store data in a first logic state or data in a second logic state depending on the magnitude of voltage applied to the bit line BL and the first and second word lines WL1 and WL2.

In addition, the diode structure 110 may output current corresponding to stored data or may hold the stored data without loss.

For example, data in a first logic state may represent "1", and data in a second logic state may represent "0". In addition, in the above description, data in a first logic state corresponds to "1", and data in a second logic state corresponds to "0", but such association may be flexibly changed depending on memory setting.

In addition, operation of storing data in a first logic state in the diode structure 110 as a memory may be referred to as programming.

In addition, operation of storing data in a second logic state in the diode structure 110 as a memory may be referred to as erasing.

That is, the present disclosure may implement a feedback field-effect electronic device using a feedback loop operation, capable of implementing a feedback loop memory mechanism by selectively applying voltage to a bit line and two word lines.

In addition, the length of each region may be 50 nm. The doping concentration of the diode structure 110 may be $1\times10^{20}$ cm$^{-3}$ for source, drain, and n$^+$ doping channel regions.

The intrinsic region 112 may be lightly p-type doped in a doping concentration of $2\times10^{15}$ cm$^{-3}$. In an access transistor, source/drain and channel regions may have doping concentration of $1\times10^{20}$ cm$^{-3}$ and $1\times10^{17}$ cm$^{-3}$, respectively.

Any one of the first and second gate electrodes 115 and 124 may be a platinum gate electrode. The platinum gate electrode (work function=5.65 eV) may be used for a positive threshold voltage.

In addition, an aluminum electrode may be used as the drain and source electrodes.

For example, the first and second word lines WL1 and WL2 may be referred to as control lines.

The present disclosure may provide a feedback field-effect electronic device having a p-n-i-n transistor and an access transistor connected in series to improve switching characteristics and lower operating voltage.

In addition, the present disclosure may provide a feedback field-effect electronic device having a p-n-i-n transistor and an access transistor connected in series to overcome limitations on the subthreshold swing of a conventional MOSFET to secure a high current sensing margin.

The components of the diode structure 110 will be described in detail with reference to FIG. 1B.

Figure 1B:
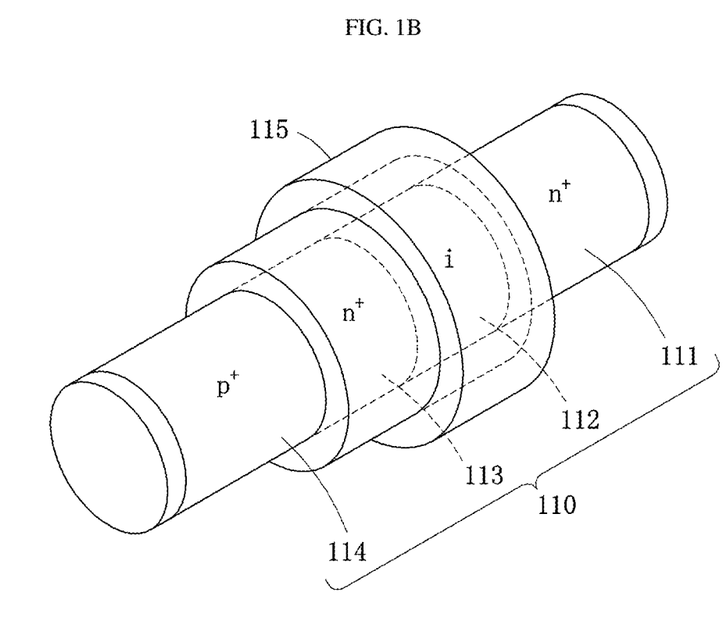

Referring to FIG. 1B, the diode structure 110 may include the first source region 111, the first drain region 114, the intrinsic region 112 disposed between the first source region 111 and the first drain region 114, and the barrier region 113 disposed between the intrinsic region 112 and the first drain region 114.

According to one embodiment of the present disclosure, in the diode structure 110, the first gate electrode 115 may be disposed so as to surround the intrinsic region 112.

For example, the diode structure 110 may operate as a switch or volatile memory based on a drain voltage applied to the first drain region 114 and a gate voltage applied through the first gate electrode 115 and a second gate electrode (not shown). In this case, the second gate electrode may be located in an access electronic device.

According to one embodiment of the present disclosure, the diode structure 110 may have a channel length (LCH) of 100 nm and a channel diameter of 10 nm, and the thickness of a gate oxide may be 2 nm.

According to one embodiment of the present disclosure, the diode structure 110 may operate as an n-channel semiconductor device, and may exhibit similar characteristics to an n-channel MOSFET device except for hysteresis characteristics.

According to one embodiment of the present disclosure, the diode structure 110 may be vertically or horizontally formed on a substrate, and the substrate may be a single-crystal silicon substrate, and the diode structure 110 may be a silicon substrate in a polycrystalline or single crystal state.

According to another embodiment, the diode structure 110 may be doped with a first or second conductivity type depending on vertical positions on a substrate.

In this case, the first conductivity type may be n-type, and the second conductivity type may be p-type.

For example, a first gate insulating film 115 may be disposed so as to surround the intrinsic region 112, and may be a silicon oxide film.

First and second gate insulating films 121 and 131 may selectively surround the intrinsic region 112, or may surround both the barrier region 113 and the intrinsic region 112.

For example, the diode structure 110 may exhibit a p$^+$-n$^+$-i-n$^+$ structure, and may include a first p-n junction, a second p-n junction, and a third p-n junction.

In this case, p$^+$ may indicate a case wherein doping is performed with a high concentration of a p-type impurity, and n$^+$ may indicate a case wherein doping is performed with a high concentration of an n-type impurity.

For example, an n-channel may indicate a case wherein both sides of the diode structure 110 with respect to the intrinsic region 112 are doped with an n-type impurity.

In addition, a p-channel may indicate a case wherein both sides of the diode structure 110 with respect to the intrinsic region 112 are doped with a p-type impurity.

Therefore, the present disclosure may implement a feedback field-effect electronic device having a p-n-i-n transistor and an access transistor connected in series to perform a high-speed memory operation without increasing leakage current.

In addition, the present disclosure may provide a feedback field-effect electronic device having a p-n-i-n transistor and an access transistor connected in series to improve switching characteristics and lower operating voltage.

According to one embodiment of the present disclosure, the diode structure 110 may store data based on the voltage magnitude of a bit line when a gate voltage is applied through first and second word lines.

That is, the diode structure 110 may store data in a first logic state when a gate voltage is applied through first and second word lines, and the voltage magnitude of a bit line is greater than a reference voltage.

In addition, the diode structure 110 may store data in a second logic state when the voltage magnitude of a bit line is less than a reference voltage.

In this case, the reference voltage may correspond to a voltage of 1.2 V.

For example, the diode structure 110 may hold pre-stored data when a gate voltage is not applied through first and second word lines, and the voltage magnitude of a bit line is greater than a reference voltage.

In addition, the diode structure 110 may recognize a first gate voltage as a first state when the first gate voltage of the first word line is greater than a first threshold voltage. For example, the first threshold voltage may correspond to a voltage of about 0.6 V.

According to one embodiment of the present disclosure, the diode structure 110 may recognize a second gate voltage as a first state when the second gate voltage of the second word line is greater than a second threshold voltage. For example, the second threshold voltage may correspond to a voltage of about 1 V.

For example, the first state may be a state corresponding to "1" in a logic circuit, and the second state may be a state corresponding to "0" in a logic circuit.

According to one embodiment of the present disclosure, the diode structure 110 may output current to a source line through a second source region when a gate voltage is applied only through the second word line among the first and second word lines, and the voltage magnitude of a bit line is greater than a reference voltage.

For example, the operation of the diode structure 110 that outputs current through a source line may correspond to a read operation.

The components of the access electronic device 120 will be more specifically described with reference to FIG. 1C.

Figure 1C:
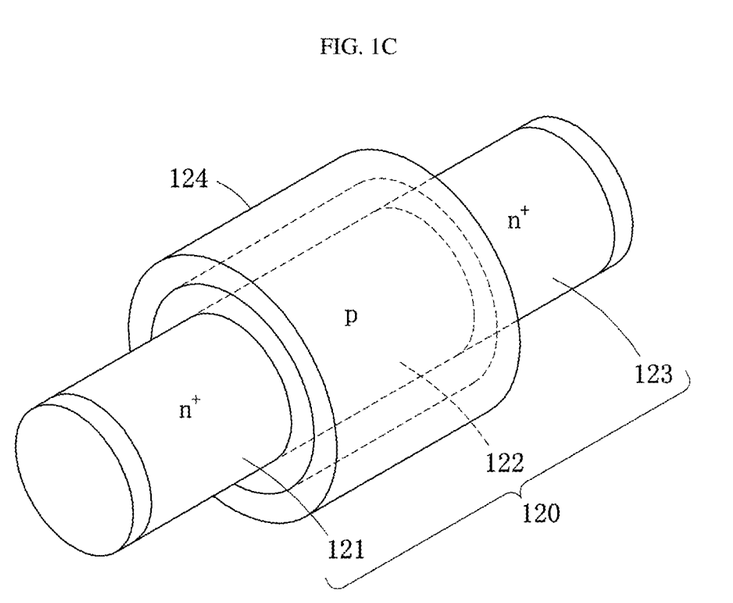

Referring to FIG. 1C, the access electronic device 120 may include a second drain region 121, the gate region 122, a second source region 123, and the second gate electrode 124 disposed so as to surround the gate region 122. For example, the access electronic device 120 may be referred to as an access transistor or an n-channel SiNW MOSFET transistor.

According to one embodiment of the present disclosure, in the access electronic device 120, the second drain region 121 and the second source region 123 may be doped with an n-type impurity, and the gate region may be doped with a p-type impurity.

For example, p may indicate a case wherein doping is performed with a low concentration of a p-type impurity, and $n^+$ may indicate a case wherein doping is performed with a high concentration of an n-type impurity.

According to one embodiment of the present disclosure, the access electronic device 120 may control the memory operation of the diode structure 110 using the voltage of the second word line.

Figure 2A:
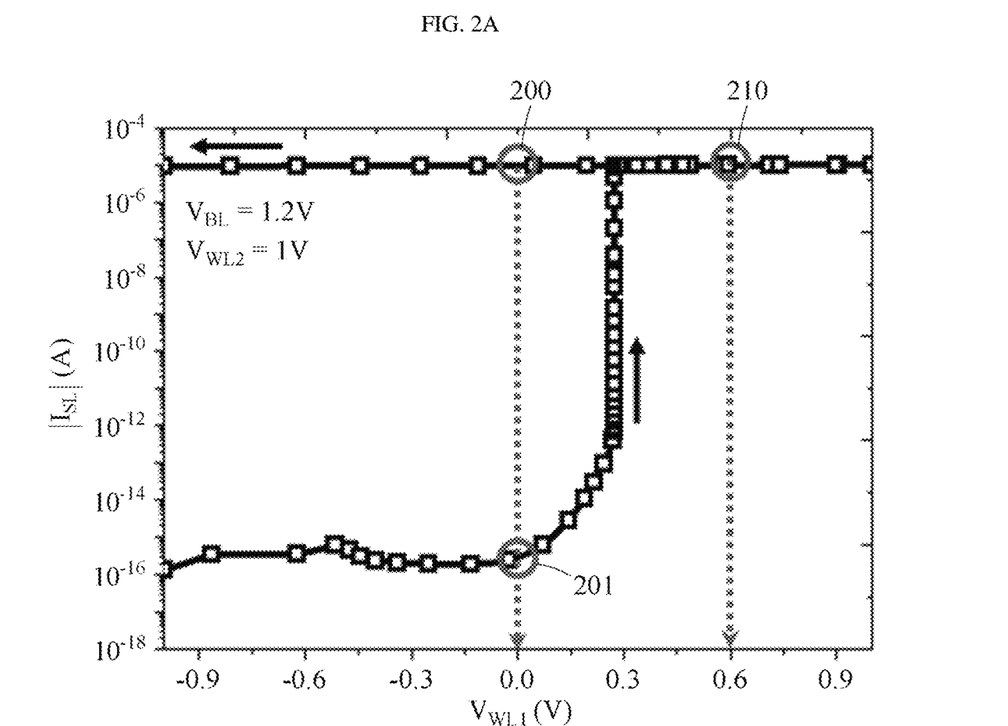
FIGS. 2A and 2B are graphs showing the operation characteristics of a feedback field-effect electronic device according to one embodiment of the present disclosure.
Figure 2B:
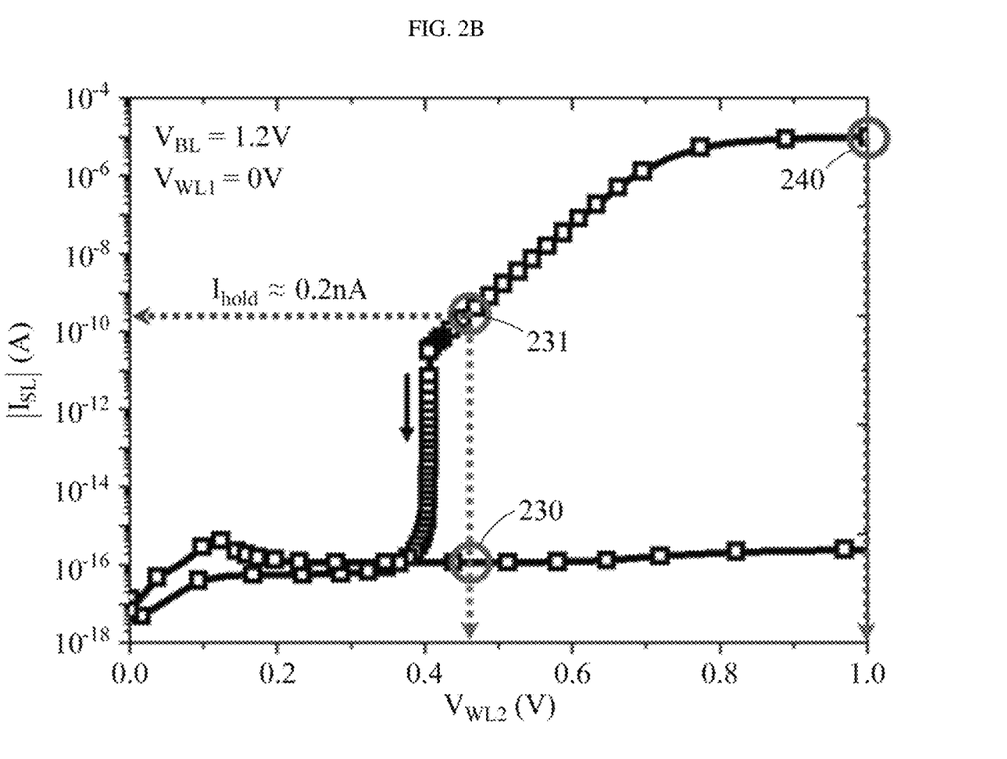

FIGS. 2A and 2B are graphs showing the operation characteristics of a feedback field-effect electronic device according to one embodiment of the present disclosure.

Referring to FIG. 2A, in the graphs, first, second, and third points 200, 201, 210 are shown. The graphs show a state wherein a bit-line voltage and a second word-line voltage are applied.

According to one embodiment of the present disclosure, since the voltage of a first word line is not applied at the first and second points 200 and 201 in the diode structure, the feedback field-effect electronic device may output current through a source line. In addition, since the output current at the first point 200 is greater than reference current, the output current at the first point 200 may be recognized as a first logic state, and since the output current at the second point 201 is less than reference current, the output current at the second point 201 may be recognized as a second logic state.

In addition, in the diode structure, when a first word-line voltage is applied at the third point 210, a bit-line voltage is greater than a reference voltage. Therefore, a first logic state may be stored.

For example, the diode structure may store a first logic state when a first word-line voltage is greater than a first threshold voltage, a second word-line voltage is greater than a second threshold voltage, and a bit-line voltage is greater than a reference voltage.

For example, when the bit-line voltage is greater than a reference voltage, the bit-line voltage may be close to 1.2 V. When the bit-line voltage is less than a reference voltage, the bit-line voltage may be close to 0.6 V.

In addition, when the first word-line voltage is greater than a first threshold voltage, the first word-line voltage may be close to 0.6 V. When the first word-line voltage is less than a first threshold voltage, the first word-line voltage may be close to 0 V.

In addition, when the second word-line voltage is greater than a second threshold voltage, the second word-line voltage may be close to 1 V. When the second word-line voltage is less than a second threshold voltage, the second word-line voltage may be close to 0.45 V.

Referring to FIG. 2B, in the graph, first, second, and third points 230, 231, and 240 are shown. The graph shows a state wherein a bit-line voltage is applied and a first word-line voltage is not applied.

According to one embodiment of the present disclosure, the first and second points 230 and 231 represent a case wherein the data of the feedback field-effect electronic device is in a hold state.

According to one embodiment of the present disclosure, current measured at the first point 230 is less than reference current. In this case, the feedback field-effect electronic device may hold data in a second logic state. In addition, current measured at the second point 231 is greater than reference current. In this case, the feedback field-effect electronic device may hold data in a first logic state.

In addition, since the measured voltage of a second word line is less than or equal to the second threshold voltage, the magnitude of current is only illustratively shown in the graph, and is not related to a read operation.

According to one embodiment of the present disclosure, a second word-line voltage is greater than a second threshold voltage at the third point 240. In this case, a write or read operation may be performed.

That is, when a first word-line voltage is greater than a first threshold voltage, a write operation may be performed. When a first word-line voltage is less than a first threshold voltage, a read operation may be performed.

According to FIGS. 2A and 2B, when bit-line voltages and gate voltages shown in Table 1 below are applied, the feedback field-effect electronic device according to one embodiment of the present disclosure may implement a feedback loop memory mechanism.

TABLE 1

|  | Program (write "1") | Erase (write "0") | Standby (hold) | Read |
|---|---|---|---|---|
| $V_{BL}$ (V) | 1.2 V | 0.6 V | 1.2 V | 1.2 V |
| $V_{WL1}$ (V) | 0.6 V | 0.6 V | 0 V | 0 V |
| $V_{WL2}$ (V) | 1 V | 1 V | 0.45 V | 1 V |

According to Table 1, in the feedback field-effect electronic device, when the diode structure is activated as a memory by simultaneously receiving voltage through the first and second word lines WL1 and WL2, a first logic state is stored when the applied bit-line voltage corresponds to 1.2 V.

In this case, the voltage of the first word line WL1 may be correspond to 0.6 V, and the voltage of the second word line WL2 may correspond to 1 V.

In addition, when the voltage of the first word line WL1 is close to 0 V, the voltage of the first word line WL1 may not be recognized as an applied state.

In addition, when the voltage of the second word line WL2 is close to 0.45 V, the voltage of the second word line WL2 may not be recognized as an applied state.

That is, when a bit-line voltage applied to the feedback field-effect electronic device is 1.2 V, a programming operation may be performed.

In addition, when a bit-line voltage applied to the feedback field-effect electronic device corresponds to a value less than 1.2 V, e.g., 0.6 V, a second logic state is stored.

That is, a bit-line voltage applied to the feedback field-effect electronic device corresponds to 0.6 V, an erasing operation may be performed.

In addition, in the feedback field-effect electronic device, a read operation may be performed as a voltage pulse is applied only through the second word line in a state wherein a bit-line voltage is applied.

In addition, the feedback field-effect electronic device may hold stored data based on voltage applied to the first drain region when a voltage pulse is not applied to both the first and second word lines in a state wherein a bit-line voltage is applied.

In this case, the operation of holding applied data may be referred to as hold.

According to one embodiment of the present disclosure, the feedback field-effect electronic device may determine whether stored data is in a first logic state or a second logic state based on current output through the source line of an access transistor when only a bit-line voltage and a second word-line voltage are applied.

In addition, according to one embodiment of the present disclosure, the feedback field-effect electronic device may hold stored data as long as a bit-line voltage of 1.2 V is supplied.

In this case, the current of the programmed memory cell may be reduced to 0.2 nA by reducing the voltage of the second word line applied to the access transistor to reduce power consumption in a wait state.

Therefore, the feedback field-effect electronic device according to one embodiment of the present disclosure may consume less power in a wait state, and thus may be used as a low-power memory device.

Figure 3A:
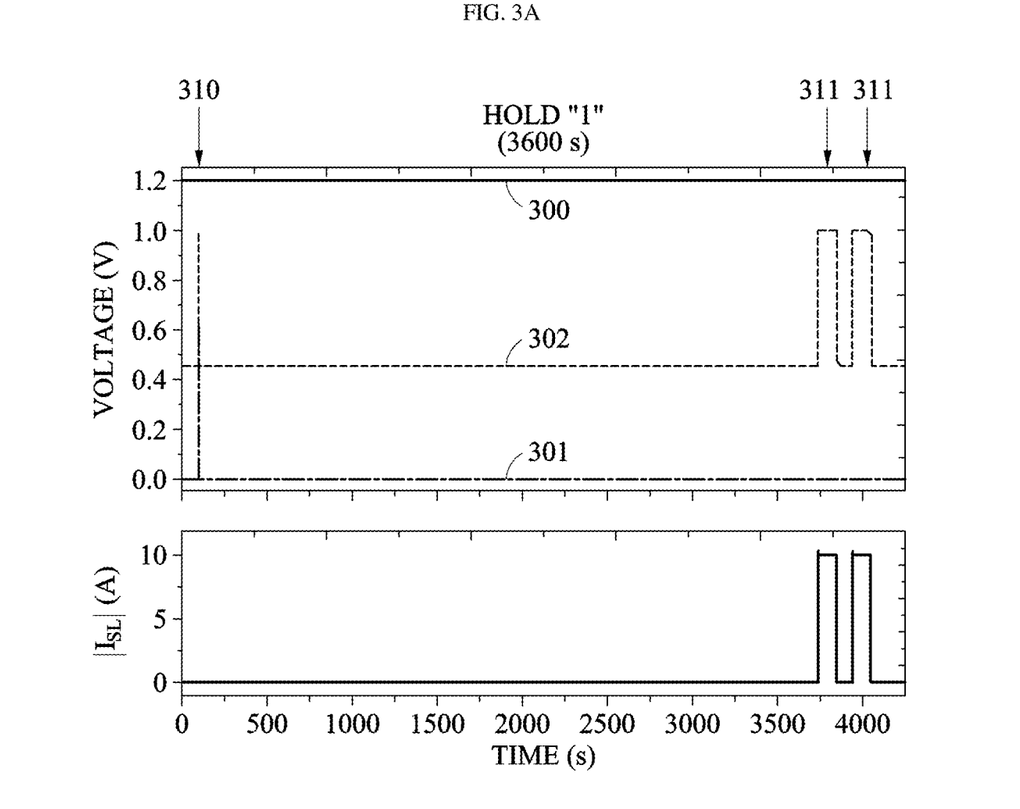
FIGS. 3A and 3B are graphs showing the data retention characteristics of a feedback field-effect electronic device according to one embodiment of the present disclosure.
Figure 3B:
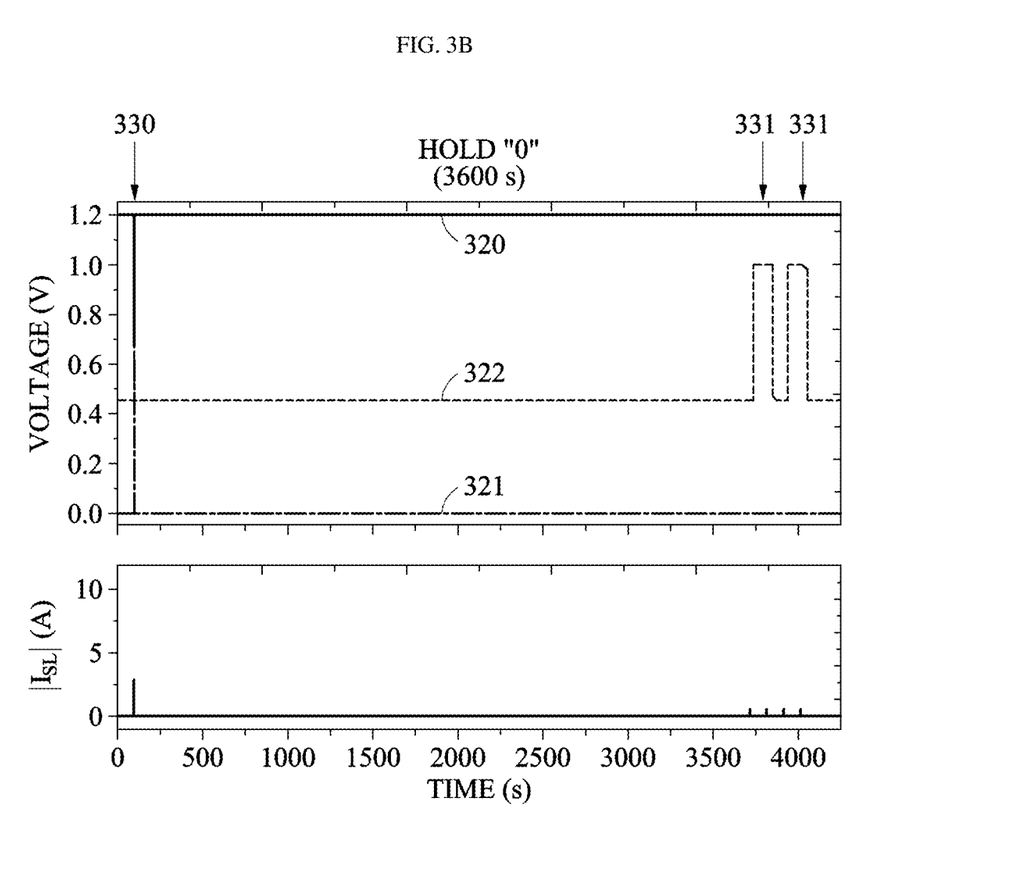

FIGS. 3A and 3B are graphs showing the data retention characteristics of a feedback field-effect electronic device according to one embodiment of the present disclosure.

Referring to FIG. 3A, in the graph, the horizontal axis represents change in time, and the vertical axis represents applied voltage and current.

For example, in the graph, first and second time points 310 and 311 are shown. The first time point 310 represents a case wherein both first and second word-line voltages 301 and 302 exceed respective threshold voltages.

In addition, the applied bit-line voltage is constantly greater than a reference voltage regardless of change in time.

Therefore, the feedback field-effect electronic device according to one embodiment of the present disclosure may store data in a first logic state at the first time point 310.

That is, the feedback field-effect electronic device is in a state wherein data in a first logic state is stored, the first and second word-line voltages are not applied, and only the bit-line voltage is applied to hold the data.

The feedback field-effect electronic device according to one embodiment of the present disclosure receives the second word-line voltage 302 twice at the second time points 311, and outputs current corresponding to data in a first logic state at each of the second time points 311.

That is, in the feedback field-effect electronic device, data stored at the first time point 310 may be held until the second time points 311.

Referring to FIG. 3B, in the graph, the horizontal axis represents change in time, and the vertical axis represents applied voltage and current.

For example, in the graph, first and second time points 330 and 331 are shown. At the first time point 330, both applied first and second word-line voltages 321 and 322 are greater than a threshold voltage, but a bit-line voltage temporarily becomes lower than a reference voltage.

Thereafter, the applied bit-line voltage is constantly greater than the reference voltage regardless of change in time.

Therefore, the feedback field-effect electronic device according to one embodiment of the present disclosure may store data in a second logic state at the first time point 330.

That is, the feedback field-effect electronic device is in a state wherein data in a second logic state is stored, the first and second word-line voltages are not applied, and only the bit-line voltage is applied to hold the data.

The feedback field-effect electronic device according to one embodiment of the present disclosure receives the second word-line voltage 322 twice at the second time points 331, and outputs current corresponding to data in a second logic state at each of the second time points 331.

That is, in the feedback field-effect electronic device, data stored at the first time point 330 may be held until the second time points 331.

Figure 4:
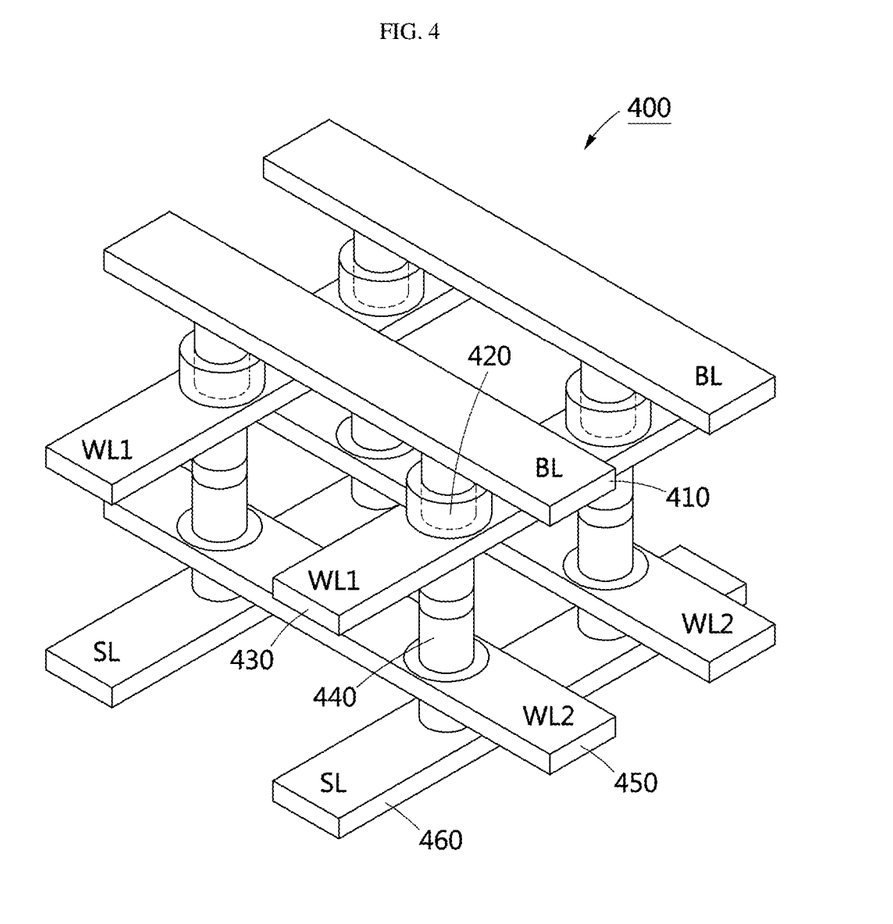
FIG. 4 is a three-dimensional schematic diagram of an array circuit including a plurality of feedback field-effect electronic devices according to one embodiment of the present disclosure.

FIG. 4 is a three-dimensional schematic diagram of an array circuit including a plurality of feedback field-effect electronic devices according to one embodiment of the present disclosure.

Referring to FIG. 4, an array circuit 400 may include a plurality of feedback field-effect electronic devices. For example, the array circuit may be composed of four feedback field-effect electronic devices, and may be a 2×2 array circuit.

According to one embodiment of the present disclosure, any one of the feedback field-effect electronic devices may include an access electronic device and a diode structure.

For example, an access electronic device 440 may be formed in the vertical direction in series, so that, after a second source region is formed on a source line 460 and a gate region is formed, a second word line 450 is connected via a second gate electrode, a second drain region is formed, and the first source region of a diode structure 420 is formed on the second drain region.

According to one embodiment of the present disclosure, the diode structure 420 may be formed in the vertical direction, so that, after an intrinsic region is formed on the first source region, a first word line 430 is connected via a first gate electrode, a barrier region is formed on the intrinsic region, a first drain region is formed on the barrier region, and a bit line 410 is connected to the first drain region.

According to one embodiment of the present disclosure, the feedback field-effect electronic device may have a structure in which the first and second word lines 430 and 450 are arranged to be perpendicular to each other.

Compared to a structure in which word lines are arranged to be parallel to each other, the carrier lifetime of the intrinsic region of the feedback field-effect electronic device may be longer.

In addition, the feedback field-effect electronic device is based on word lines having a perpendicular structure, exhibiting excellent resistance against disturbance.

In addition, the feedback field-effect electronic device may provide improved retention characteristics based on increase in carrier lifetime in the intrinsic region.

Figure 5:
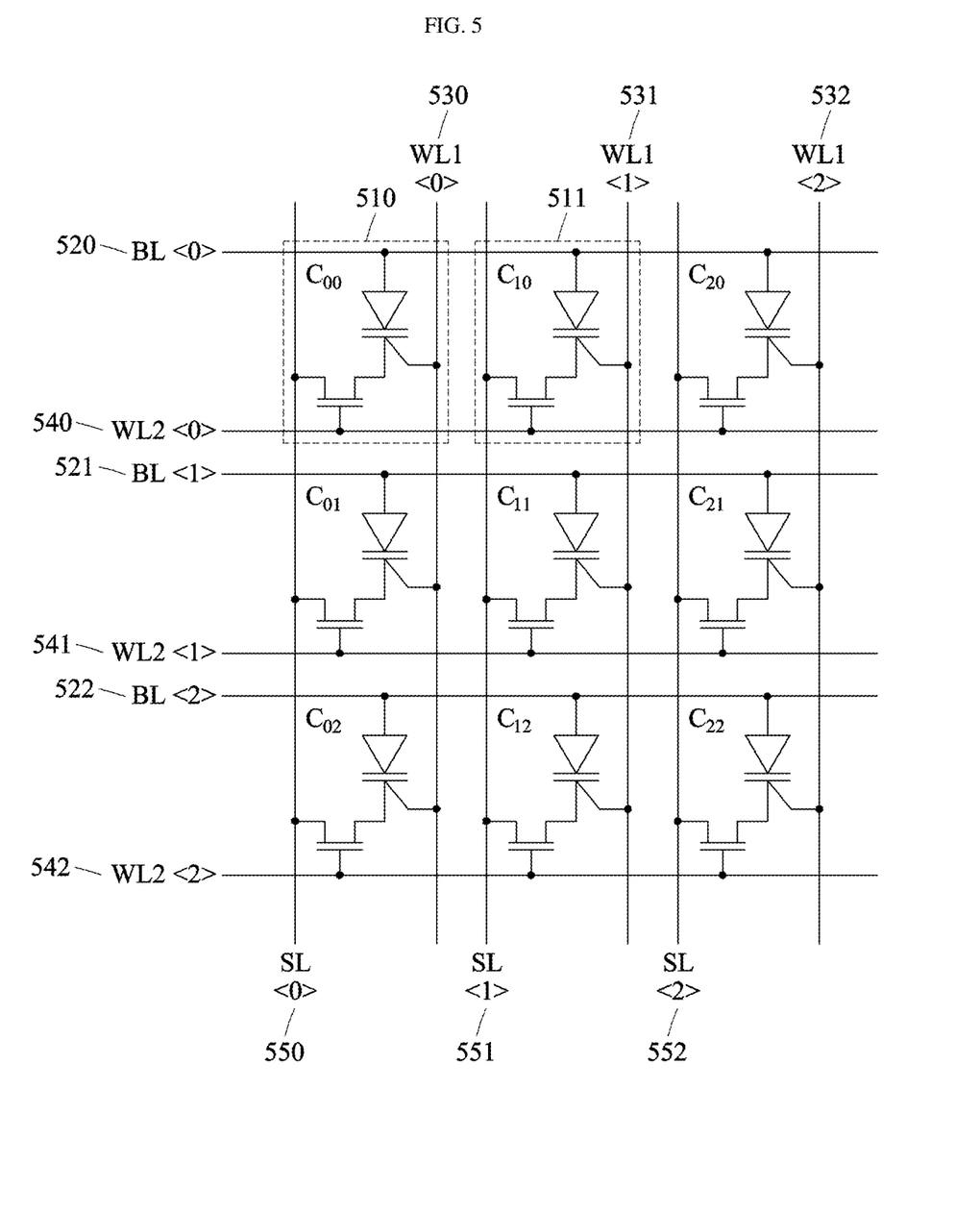
FIG. 5 is a schematic diagram of an array circuit including a plurality of feedback field-effect electronic devices according to one embodiment of the present disclosure.

FIG. 5 is a schematic diagram of an array circuit including a plurality of feedback field-effect electronic devices according to one embodiment of the present disclosure.

Referring to FIG. 5, the array circuit may be configured to include nine feedback field-effect electronic devices. However, a 3×3 structure is only an example, and the number of the feedback field-effect electronic devices is not limited.

The array circuit may include a second word line and a bit line for each row, and may include a first word line and a source line for each column.

That is, the array circuit may include bit lines 520 to 522, first word lines 530 to 532, second word lines 540 to 542, and source lines 550 to 552.

Referring to the array circuit, first and second feedback field-effect electronic devices 510 and 511 may share the bit line 520 and the second word line 540.

According to one embodiment of the present disclosure, the array circuit may perform a random access operation by selectively applying voltage to the bit line, the first word line, and the second word line.

That is, the present disclosure may implement a feedback field-effect electronic device having a p-n-i-n transistor and an access transistor connected to each other to perform random access.

Figure 6:
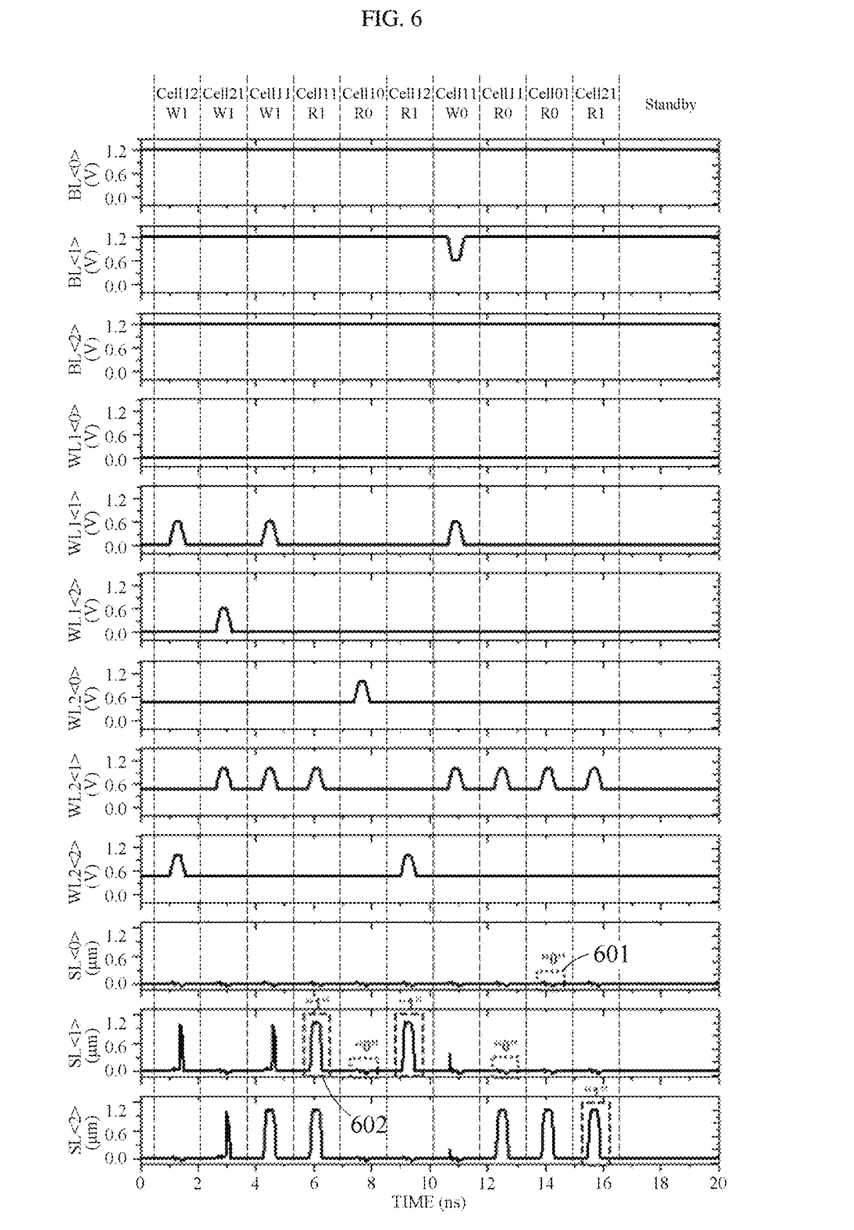
FIG. 6 includes graphs showing the operation characteristics of an array circuit including a plurality of feedback field-effect electronic devices according to one embodiment of the present disclosure.

FIG. 6 includes graphs showing the operation characteristics of an array circuit including a plurality of feedback field-effect electronic devices according to one embodiment of the present disclosure.

FIG. 6 shows the operation characteristics of the 3×3 array circuit of FIG. 5.

Referring to the graphs, the cells are initially initialized to a "0" state, and a time sequence of 30 ns including all static memory operation is simulated.

The array circuit according to one embodiment of the present disclosure may provide reliable random access memory function with fast write speed and nondestructive read.

The horizontally arranged second word lines WL2 may support parallel write and read operations, but may cause unnecessary read current.

Unnecessary current may be removed by connecting external transistors to each of the source lines SL. Therefore, the array circuit may detect current signal 602 while minimizing noise.

According to another embodiment, the array circuit may provide current sense mode signal 601. For example, the array circuit may reduce delay time generated in the process of converting current signal into voltage signal by using the current sense mode signal 601.

The present disclosure may implement an array circuit including a plurality of feedback field-effect electronic devices, wherein interference and sneak current between cells are blocked through access transistors included in each of the feedback field-effect electronic devices.

The present disclosure can implement a feedback field-effect electronic device using a feedback loop operation, capable of implementing a feedback loop memory mechanism by selectively applying voltage to a bit line and two word lines.

The present disclosure can implement a feedback field-effect electronic device having a p-n-i-n transistor and an access transistor connected to each other to perform random access.

The present disclosure can implement a feedback field-effect electronic device having a p-n-i-n transistor and an access transistor connected in series to perform a high-speed memory operation without increasing leakage current.

The present disclosure can implement an array circuit including a plurality of feedback field-effect electronic devices, wherein interference and sneak current between cells are blocked through access transistors included in each of the feedback field-effect electronic devices.

The present disclosure can implement a feedback field-effect electronic device having a p-n-i-n transistor and an access transistor connected in series to improve switching characteristics and lower operating voltage.

The present disclosure can implement a feedback field-effect electronic device having a p-n-i-n transistor and an access transistor connected in series to overcome limitations on the subthreshold swing of a conventional MOSFET to secure a high current sensing margin.

The present disclosure can implement a feedback field-effect electronic device, in which first and second word lines are arranged perpendicular to each other so that occurrence of disturbance between word lines can be prevented and a long carrier lifetime can be secured in a channel region to secure a high retention capacity.

The claims of the present disclosure or the methods according to embodiments described in this specification may be implemented in hardware, software, or a combination of hardware and software.

Such software may be stored on a computer-readable storage medium. The computer-readable storage medium stores at least one program (software module) including instructions for causing an electronic device to perform the method of the present disclosure when executed by at least one processor in the electronic device.

Such software may be stored in the form of a volatile storage device or a non-volatile storage device such as read only memory (ROM), in the form of memory such as random access memory (RAM), memory chips, and device or integrated circuits, or in an optical or magnetic readable medium, such as compact disc-ROMs (CD-ROMs), digital versatile discs (DVDs), magnetic disks, and magnetic tapes.

The storage device and medium are machine-readable storage means suitable for storing programs including instructions for implementing embodiments when executed.

In the above-described specific embodiments, elements included in the disclosure are expressed in singular or plural in accordance with the specific embodiments.

However, the singular or plural representations are appropriately selected for the situation presented for convenience of explanation, and the above-described embodiments are not limited to the singular or plural constituent elements. In addition, elements may be composed of the singular number, even when the elements are expressed in the plural number, and an element may be composed of the plural number, even when the element is expressed in the singular number.

The aforementioned description is provided only to illustrate embodiments according to the present disclosure. Those skilled in the art will appreciate that various modifications, additions and substitutions are possible, without departing from the scope and spirit of the disclosure.

Therefore, it should be understood that there is no intent to limit the disclosure to the embodiments disclosed, rather, the disclosure is to cover all modifications, equivalents, and alternatives falling within the spirit and scope of the disclosure as defined by the claims.

DESCRIPTION OF SYMBOLS

110: DIODE STRUCTURE
111: FIRST SOURCE REGION
112: INTRINSIC REGION
113: BARRIER REGION
114: FIRST DRAIN REGION
115: FIRST GATE ELECTRODE
120: ACCESS ELECTRONIC DEVICE
121: SECOND SOURCE REGION
122: GATE REGION
123: SECOND DRAIN REGION
124: SECOND GATE ELECTRODE

What is claimed is:

1. An array circuit, comprising:
   a plurality of feedback field-effect electronic devices in which a source region of a diode structure and a drain region of an access electronic device are connected in series,
   wherein the diode structure is connected to a bit line and a first word line;
   the access electronic device is connected to a source line and a second word line; and
   a random access operation is performed by selectively applying voltage to the bit line and the first and second word lines.

2. The array circuit according to claim 1, wherein, when a gate voltage is applied through the first and second word lines, and voltage magnitude of the bit line is greater than a reference voltage, the diode structure stores data in a first logic state, and when voltage magnitude of the bit line is less than a reference voltage, the diode structure stores data in a second logic state.

3. The array circuit according to claim 2, wherein, when a gate voltage is not applied through the first and second word lines, and voltage magnitude of the bit line is greater than a reference voltage, the diode structure holds the stored data.

4. The array circuit according to claim 3, wherein, when a first gate voltage of the first word line is greater than a first threshold voltage, the diode structure recognizes the first gate voltage as a first state, and when a second gate voltage of the second word line is greater than a second threshold voltage, the diode structure recognizes the second gate voltage as the first state.

5. The array circuit according to claim 2, wherein, when a gate voltage is applied only through the second word line among the first and second word lines, and voltage magnitude of the bit line is greater than a reference voltage, the diode structure outputs current to the source line through the second source region.

6. The array circuit according to claim 5, wherein, when magnitude of the output current is greater than reference current, the stored data is in a first logic state, and when magnitude of the output current is less than reference current, the stored data is in a second logic state.

7. The array circuit according to claim 1, wherein the diode structure comprises a first source region, a first drain region, an intrinsic region disposed between the first source region and the first drain region, a barrier region disposed between the intrinsic region and the first drain region, and a first gate electrode disposed so as to surround the intrinsic region; and
   the access electronic device comprises a second source region, a second drain region, a gate region, and a second gate electrode disposed so as to surround the gate region,
   wherein the access electronic device connects the first source region and the second drain region in series.

8. The array circuit according to claim 7, wherein the first drain region is connected to a bit line; the second source region is connected to a source line; the first gate electrode is connected to a first word line; and the second gate electrode is connected to a second word line.

9. The array circuit according to claim 8, wherein the access electronic device is formed in a vertical direction in series, so that, after the second source region is formed on the source line and the gate region is formed, the second word line is connected via the second gate electrode, the second drain region is formed, and the first source region is formed on the second drain region.

10. The array circuit according to claim 9, wherein the diode structure is formed in the vertical direction, so that, after the intrinsic region is formed on the first source region, the first word line is connected via the first gate electrode, the barrier region is formed on the intrinsic region, the first drain region is formed on the barrier region, and a bit line is connected to the first drain region.

11. The array circuit according to claim 8, wherein, when a gate voltage is applied through the first and second word lines, the diode structure stores data based on voltage magnitude of the bit line.

12. The array circuit according to claim 7, wherein the feedback field-effect electronic device further comprises a first gate insulating film disposed between the first gate electrode and the intrinsic region; and
   a second gate insulating film disposed between the second gate electrode and the gate region.

* * * * *